(12) United States Patent
Sasaki (10) Patent No.: US 6,999,160 B2
(45) Date of Patent: Feb. 14, 2006

(54) OPTIMIZATION METHOD OF APERTURE TYPE OF PROJECTION ALIGNER

(75) Inventor: Suguru Sasaki, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 227 days.

(21) Appl. No.: 10/673,676

(22) Filed: Sep. 30, 2003

(65) Prior Publication Data

US 2004/0141167 A1 Jul. 22, 2004

(30) Foreign Application Priority Data

Oct. 1, 2002 (JP) ........................................ 2002-288304

(51) Int. Cl.
*G03B 27/32* (2006.01)
*G03B 27/54* (2006.01)
*G03F 9/00* (2006.01)
*G03C 5/00* (2006.01)

(52) U.S. Cl. ............................... 355/67; 355/77; 430/5; 430/30

(58) Field of Classification Search ................... 355/67, 355/77; 430/5, 30
See application file for complete search history.

(56) References Cited

U.S. PATENT DOCUMENTS 6,015,644 A  1/2000 Cirelli et al.

6,335,130 B1  1/2002 Chen et al.

FOREIGN PATENT DOCUMENTS

JP  07037769  2/1995
JP  11195592 A  7/1999

OTHER PUBLICATIONS

Chris A. Mack, "Inside PROLITH: A Comprehensive Guide to Optical Lithography Simulation", Finle Technologies, Inc., 1997, pp. 144–151.

*Primary Examiner*—Rodney Fuller
(74) *Attorney, Agent, or Firm*—Volentine Francos & Whitt, PLLC (57) ABSTRACT

In a method of optimizing a shape of an aperture, an effective light source is divided into a plurality of minute areas having same shape and size. One point light source is provided at a center of each of the divided minute areas. A normalized image light intensity slope on a wafer is obtained in consideration of a focus variation of a projection aligner for a plurality of patterns at each of the point light sources. The normalized image light intensity slope of a light intensity is used as an index. The image light intensity slope is related to an exposure amount variation of the projection aligner by one dimensional function. A common opening is selected for the shape of the aperture that is optimized for each of the patterns. The common opening is made into an optimum shape of the aperture for the patterns.

4 Claims, 13 Drawing Sheets

OPTIMIZATION METHOD OF APERTURE TYPE OF PROJECTION ALIGNER

BACKGROUND OF THE INVENTION

The present invention relates to an optimization method of an aperture type of a projection aligner.

According to JP-A-7-37769 (particularly, pages 4 to 7, FIG. 2, FIG. 3), in order to simulate a projection optical image whereby a three dimensional vector component of an imaging distribution in a projection optical system with a large aperture can be calculated by a simple method, by dividing a mask and a pupil surface in a lattice, and tracing a light ray generated on the mask surface and a light ray generated from an image of diffraction of a light source to be projected on the pupil surface as being interfaced with the divided three dimensional vector component, a sum of an electromagnetic field and a light intensity on the imaging surface is calculated.

In addition, according to JP-A-11-195592 (particularly, page 3, FIG. 1), in order to realize an aperture, an aligner, and a pattern formation for a modification illumination capable of being applied to various patterns as avoiding the troubles of having to exchange, metallic plates are superposed with each other to form a zonal center masked portion and margin masked portions are arranged at the opposite ends of the foregoing center masked portion. Turning first and second knobs leads to change of mutual interval between a width of the center masked portion and the margin masked portion. For this reason, a variable aperture having a slit width and measure of which are variable is provided between the center masked portion and the margin masked portion and one variable aperture can apply to various patterns.

By the way, according to a lithography step of a semiconductor process, in order to form a pattern that is more delicate than a theoretical resolution defined by a wave length of a light, an illumination method, so-called oblique light incident illumination, may be used.

In a lithography step of an LSI, it is often needed that a pattern having a large spatial frequency (a period of repetition is small) and a pattern having a mall spatial frequency (a period of repetition is large) are formed at the same time at a single exposure. In the lithography step, there are various causes of varying a size of the pattern, however, as a typical margin of the lithography step for ensuring accuracy of the size, a focus variance margin and an exposure amount variance margin of an aligner are mainly used.

However, a kind of the patterns to be optimized is specialized to a repetition pattern of a line and space (L/S) having the minimum size. In other words, in order to develop a resolution property of a pattern having the maxim spatial frequency capable of entering a projection lens, the aperture type is optimized.

SUMMARY OF THE INVENTION

The present invention has been made taking the foregoing problems into consideration and provides an optimization method of an aperture type of a projection aligner capable of enlarging a focus variation margin and an exposure amount variation margin of a pattern to be optimized.

In order to attain the above described problems, the present invention comprises (1) an optimization method of an aperture type of a projection aligner for, in the case of limiting an effective light source of a projection aligner by an aperture diaphragm, dividing the foregoing effective light source into minute ranges having plural equal shapes and sizes; providing one point light source at a center of the foregoing divided minute range; obtaining a normalized image light intensity slope on a wafer in consideration of a focus variation of the foregoing projection aligner and covering a plurality of patterns for each point light source; using a normalized image light intensity slope of the light intensity as an index, which is related to an exposure a mount variation of the foregoing projection aligner by one dimensional function; selecting a common opening of the aperture type that is optimized for each pattern; and making the foregoing common opening into an optimum aperture type for a plurality of patterns.

DETAILED DESCRIPTION OF THE INVENTION

With reference to the drawings, the embodiments according to the present invention will be described below.

At first, a first embodiment of the present invention will be described below with reference to FIG. 1.

Figure 1A:
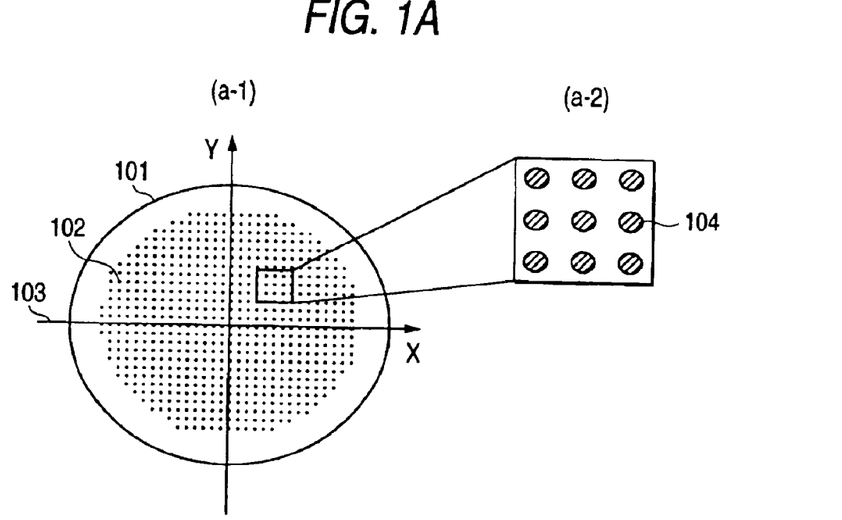
FIG. 1 is a view for showing a frame format of a projection aligner according to a first embodiment of the present invention.
Figure 1B:
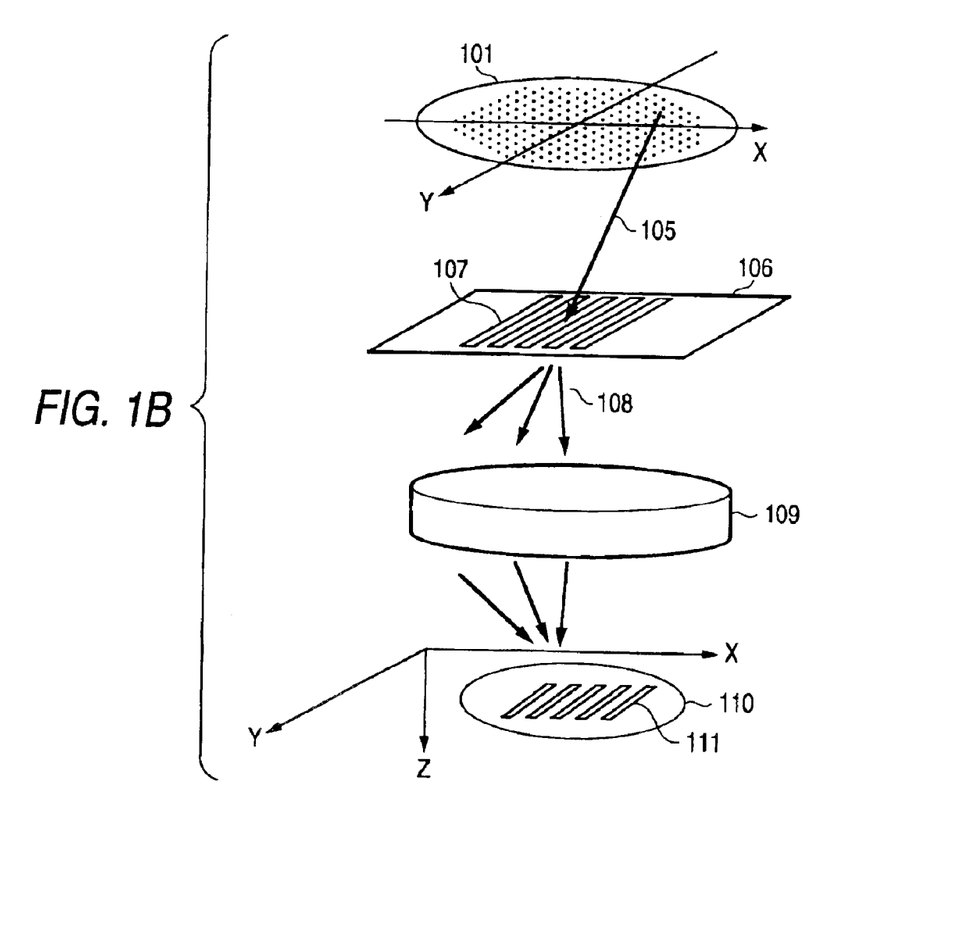

FIG. 1 is a view for showing a frame format of a projection aligner according to a first embodiment of the present invention. Further, FIG. 1(a-1) is a view for showing a frame format of a light source, FIG. 1(a-2) is a partial enlarged view of FIG. 1(a-1), and FIG. 1(b) is a view for showing a frame format of the entire configuration of the projection aligner.

In these drawings, a reference numeral 101 denotes a circle of a radius 1 on a coordinate of an effective light source that is normalized by 1, a reference numeral 102 denotes a point light source that is provided within the maximum σ of the projection aligner, a reference numeral 103 denotes an effective light source coordinate (x-y coordinate), a reference numeral 104 denotes an image of one point light source of the provided point light sources, a reference numeral 105 denotes an incident light of a reticle, a reference numeral 106 denotes a reticle, a reference numeral 107 denotes a pattern on the reticle, a reference numeral 108 denotes a diffraction light due to a pattern on the reticle, a reference numeral 109 denotes a projection lens, a reference numeral 110 denotes a wafer, and a reference numeral 111 denotes an image of the pattern that is transcribed on a resist.

At the beginning, provided that the coordinate system of the aperture is the effective light source coordinate 103, as shown in FIG. 1(a-1), it is assumed that the effective light source is divided into network regions and each region comprises a point light source 104. In this case, the effective light source means a region in a circle of a radius σ on the X-Y coordinate 103 in FIG. 1 in the case that coherence of the projection aligner is σ. This each point light source 104 can be viewed as a minute aperture opening if the minute region where the effective light source coordinate 103 is divided is made sufficiently small. Then, the region where the many point light sources 104 are collected can be viewed as one aperture opening as a whole.

According to the present embodiment, the effective light source coordinate 103 is divided in such a manner that a range of |x|=<1, |y|=<1 is divided into fifty, respectively. FIG. 1(b) shows a case that the width and the pitch size of the pattern are changed.

In the next place, with reference to the drawings, a flow of the optimization method of the aperture type will be described below.

Figure 2:
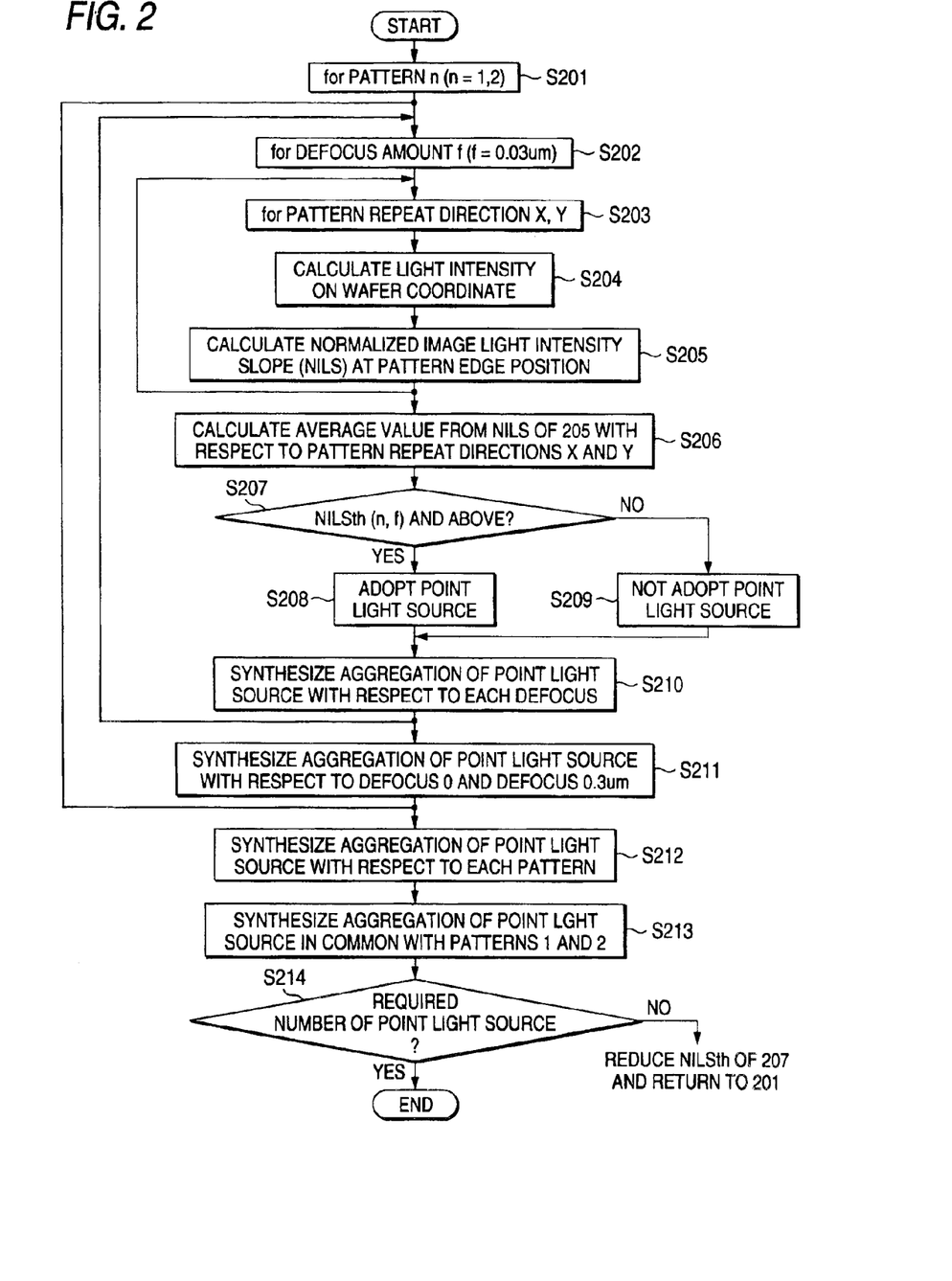
FIG. 2 is a flow chart of an optimization method of an aperture type according to the present invention.

FIG. 2 is a flow chart of an optimization method of an aperture type according to the present invention.

In this drawing, [1] at first, a pattern to be used for the optimization of the aperture type is designated (step S201). According to the present embodiment, by using a L/S pattern having repetition in one dimensional direction, a L/S pattern 1 having a repeat pitch P1=0.32 μm and a line width w1=0.13 μm in an X axial direction at the coordinate on the wafer shown in FIG. 3(a) and a L/S pattern 2 having a repeat pitch P2=1 μm and a line width w2=0.13 μm in the X axial direction at the coordinate on the wafer shown in FIG. 3(b) are designated.

Figure 3A:
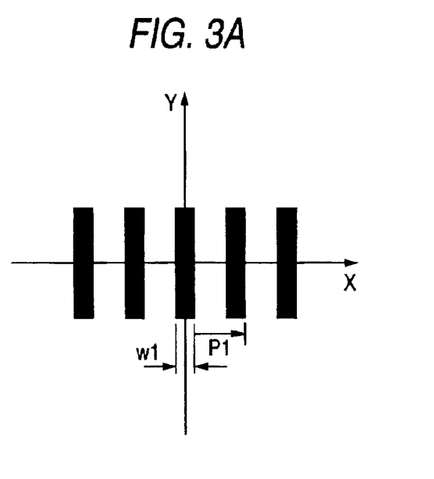
FIG. 3 is a diagram for showing a repetition pattern of one dimension according to the present invention.
Figure 3B:
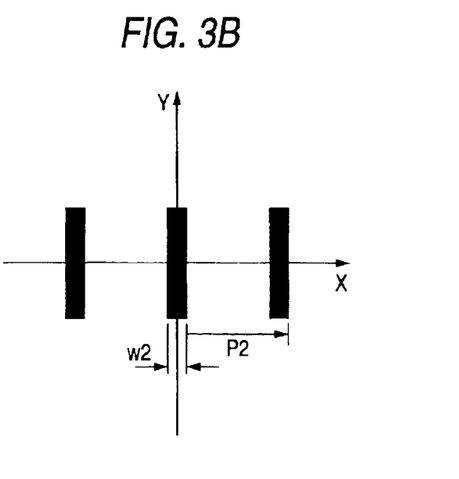
Figure 3C:
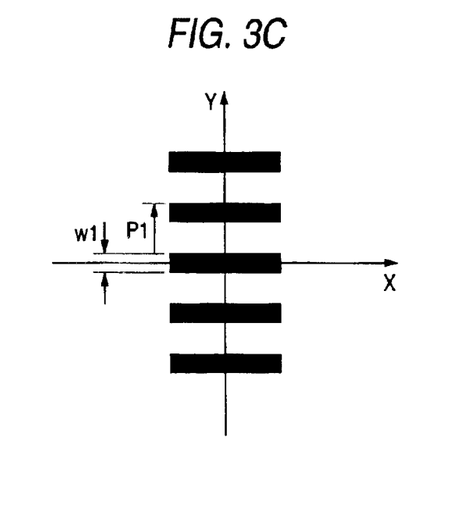
Figure 3D:
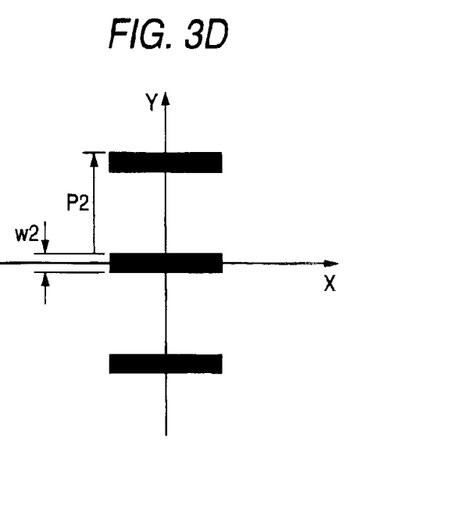

When the above described two kinds of L/S patterns having different pitches and line widths are designated in the step S201 shown in FIG. 2, in the optimization of the aperture type according to the present embodiment, four patterns in total including a pattern 3 shown in FIG. 3(c) having repetition in a Y direction that is made by rotating the pattern 1 shown in FIG. 3(a) 90 degrees and a pattern 4 shown in FIG. 3(d) having repetition in a Y direction that is made by rotating the pattern 2 shown in FIG. 3(b) 90 degrees are optimized.

However, since, in step S206 shown in FIG. 2, a result of the pattern 3 can be calculated by using the calculation result of the pattern 1 and a result of the pattern 4 can be calculated by using the calculation result of the pattern 2, in the step 201, the pattern 1 and the pattern 2 may be only designated.

[2] In the next place, in the step S202, upon carrying out the optimization of the aperture type, a defocus amount of the projection aligner to be considered is designated. According to the present embodiment, two defocus amounts, namely, a best focus and a defocus amount of 0.3 μm that is necessary for a process are designated, however, it may be possible that different three and more defocus amounts are designated so as to carry out the optimization of the aperture type. In addition, according to the present embodiment, two defocus amounts including the same defocus amount in the pattern 1 and the pattern 2, namely, the best focus, and the defocus amount of 0.3 μm that is necessary for a process are designated, however, the different defocus amounts are designated with respect to each pattern to carry out the optimization of the aperture.

[3] In the next place, in step S203, the calculation will be carried out with respect to the case that a pattern repeat direction is the X axial direction at the coordinate on the wafer and the case that a pattern repeat direction is the Y axial direction at the coordinate on the wafer, respectively. In other words, if the process comes to the step S203 in the pattern 1, the repeat direction of the pattern 1 is the X axial direction at the coordinate on the wafer, so that the calculations in step S204 and step S205 are carried out in the x axial direction and then, returning to the step S203 on the basis of these calculation results, the calculations in the step S204 and the step S205 may be carried out with respect to the pattern 3 repeat direction of which is the Y axial direction at the coordinate on the wafer.

[4] In the next place, in the step S204, with respect to a light source arranged at each point on the effective light source coordinate, a light amplitude intensity at a position (X, Y), namely, a target size of a pattern on the wafer may be obtained by a formula (1). This can be represented by two dimensional matrix A (X, Y, f) as shown in the formula (1).

$$A(X, Y, f) = \Sigma F(N, s) K(N, s, f) \exp[2\pi(N/P) + (xNA/\lambda)]X \quad (1)$$

Where, X and Y represent the coordinates on the wafer, f represents the defocus amount of the projection aligner, and Σ means that the sum of a point light source s (x, y) positioned at a point (x, y) on the effective light source coordinate is figured out.

F (N, s) represents a Fourier component that is diffracted by the reticle from each point light source s (x, y) and has a diffraction degree N capable of entering a projection lens. K (N, s, f) is so-called pupil function when a defocus amount is f, P represents a pattern repeat period, NA represents the number of the apertures, and λ represents an exposure wavelength, of the projection lens.

By using the formula (1), a light intensity distribution I (X, Y, f) on the wafer due to each point light source when the defocus amount is f may be represented by a formula (2).

$$I(X, Y, f) A^*(X, Y, f) A(X, Y, f) \quad (2)$$

Where, A*(X, Y, f) represents complex conjugate of A(X, Y, f).

[5] In the next place, in step S205, with respect to each point light source, so-called normalized image light intensity slope (NILS) at the edge portion of the pattern on the wafer may be figured out. This may be figured out as shown in a formula (3) assuming that an edge position of a line pattern of L/S is defined as (w1/2, 0).

$$NILSs(w1/2, 0, f) = w1 \cdot d[\ln[I(w1/2, 0, f)]]/dX \quad (3)$$

Where, NILSs represents a NILS value with respect to the point light source s (x, y) positioned at the point (x, y) on the effective light source coordinate, and f represents the defocus amount. In addition, w1 represents a line width of the pattern 1, in [ ] means that an natural logarithm is figured out, and d[ ]/dX means that X is differentiated at the coordinate on the wafer (X, Y).

Figure 4A:
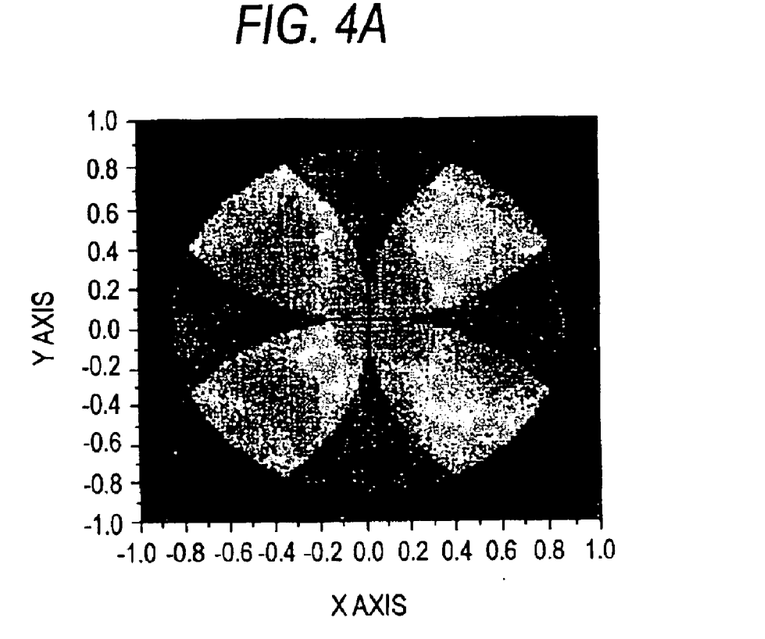
FIG. 4 is a diagram for showing a NILS provided to each point light source that is averaged with respect to a pattern 1 and a pattern 3 according to the present invention.
Figure 4B:
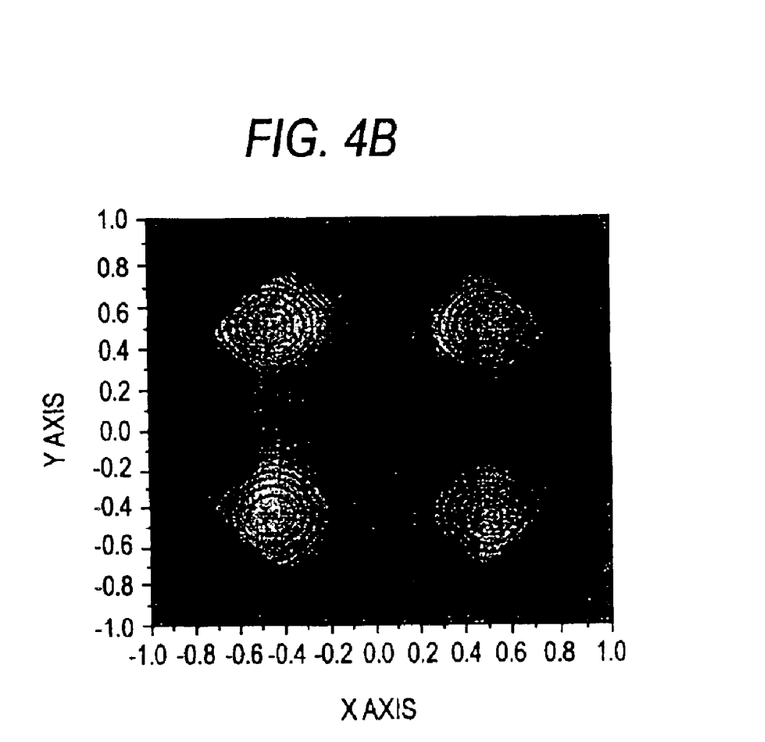

[6] In the next place, in step S206, an average value of the NILS value is figured out based on whether or not the pattern repeat direction figured out in the step S205 is the X axial direction or the Y axial direction. This calculation may be carried out with respect to each point light source. FIG. 4 shows a NILS provided to each point light source that is averaged with respect to the pattern 1 and the pattern 3, which is calculated in the step S206. FIG. 4(a) shows the result when f=0, namely, at the best focus, and FIG. 4(b) shows the result when f=0. 3 μm. FIG. 4 shows that a point light source provided in a white range has a large NILS.

[7] In the next place, in step S207, with respect to a light source arranged at each point on the effective light source coordinate, a calculation may be carried out, whereby a point light source having a NILS value not less than a certain threshold value NILSth is only selected. According to the present embodiment, the threshold value NILSth is decided as follows. The NILS and an exposure amount margin EL (%) may be related each other by one dimensional function of a formula (4) (for example, refer to a bibliography "Inside PROLITH", pp 144–151, 1997, Lithoteck Japan Corporation (written by C. A. Mack, translated by Toshiharu Matuzawa)).

$$EL(\%) = a \cdot (NILS - b) \quad (4)$$

Figure 5:
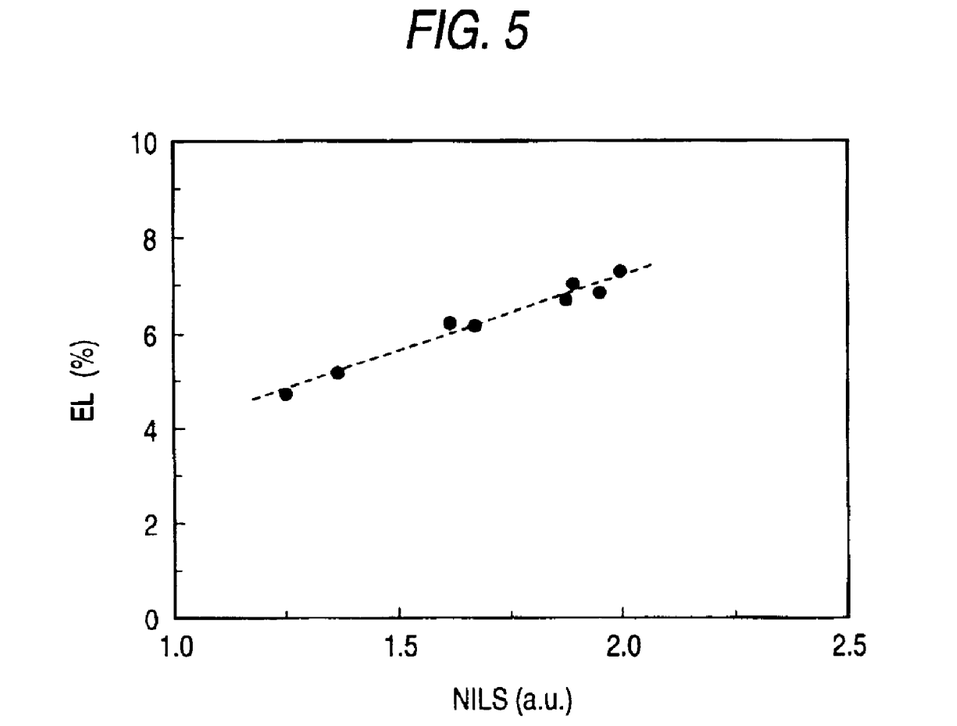
FIG. 5 is a view showing fitting of a relation between an EL and a NLS with a direct function according to the present invention.

From this formula, it can be appreciated that NILS of the light intensity distribution should be large in order to make the exposure amount margin EL large. Constant numbers a and b are changed depending on a resist process, etc., however, in the process used for the verification according to the present invention, from the slope and the intercept of a graph fitting a relation between EL and NILS with one dimensional function shown in FIG. 5, a=3.1 and b=−0.31 are established approximately. When these values are substituted for the formula (4), it may be appreciated that NILS of 1.6 is needed in order to obtain EL of 6%. For the NILSth used for the present embodiment, the same values are used for all patterns, however, a different value may be used for each pattern.

By using the above described threshold value NILSth, in step S207, it is determined whether or not the NILS value belonged to each point light source is not less than the threshold value NILSth=1.6 with respect to each point light source, and in steps S208 and S209, the point light sources are categorized into a group to be adopted and a group not to be adopted. Then, in step S210, an aggregation of the point light sources with respect to each defocus amount is obtained in each pattern.

Figure 6A:
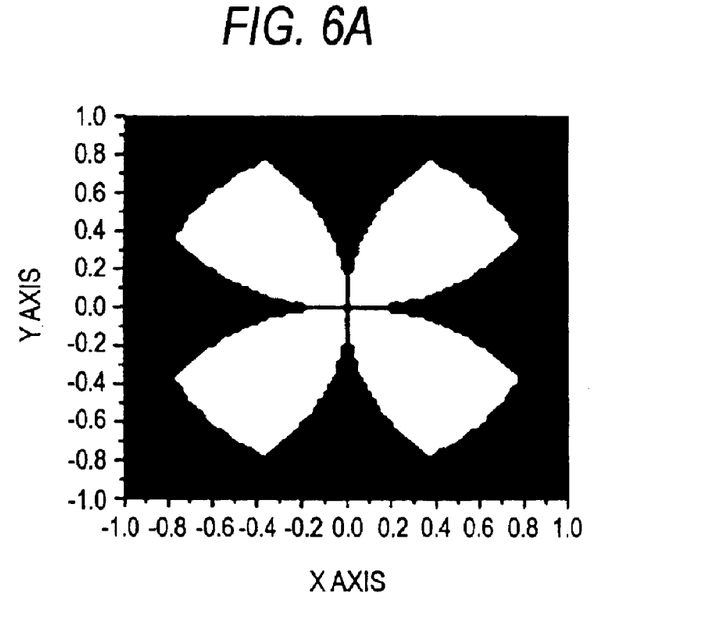
FIG. 6 is a diagram for showing a point light source that is extracted under various conditions according to the present invention.
Figure 6B:
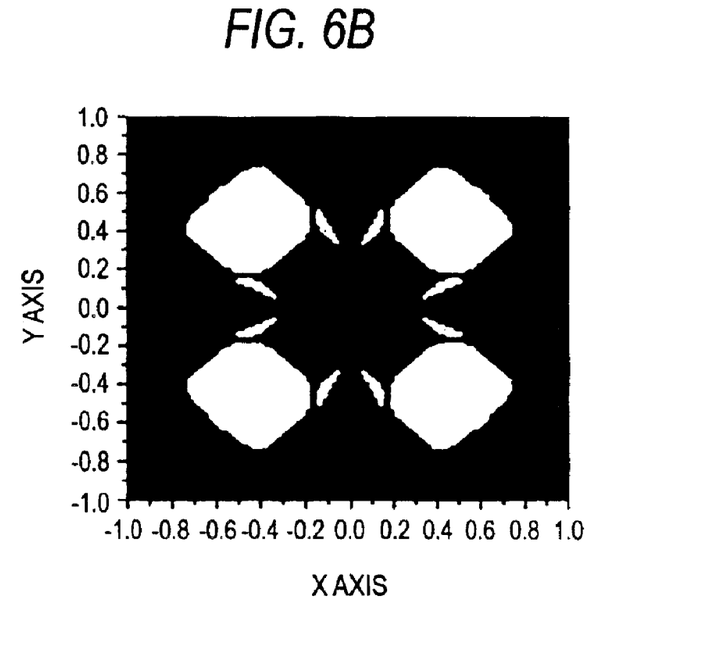

FIG. 6(a) shows an output result that is calculated in the step S210 when the best focus is realized with respect to FIG. 4(a), namely, the pattern 1 and the pattern 3. In the same way, FIG. 6(b) shows an output result that is calculated in the step S210 when the defocus amount is 0.3 μm with respect to FIG. 4(b), namely, the pattern 1 and the pattern 3. At a white portion, a point light source having NILS not less than 1.6 is positioned.

[8] In the next place, in step S211, with respect to the pattern 1 and the pattern 3, a logical product (a logical AND) of a map of the point light sources having NILS values not less than the threshold value NILSth is figured out with respect to each of the case of the best focus as shown in FIG. 6(a) and the case of the defocus of 0.3 μm as shown in FIG. 6(b), so that the aggregation of the point light sources is outputted as a map of the point light source with respect to each of L/S patterns (step S212). In this case, the logical product is figured out in order to extract the point light source having the NILS value not less than the threshold value in common in each case of the best focus and the defocus of 0.3 μm.

Figure 7:
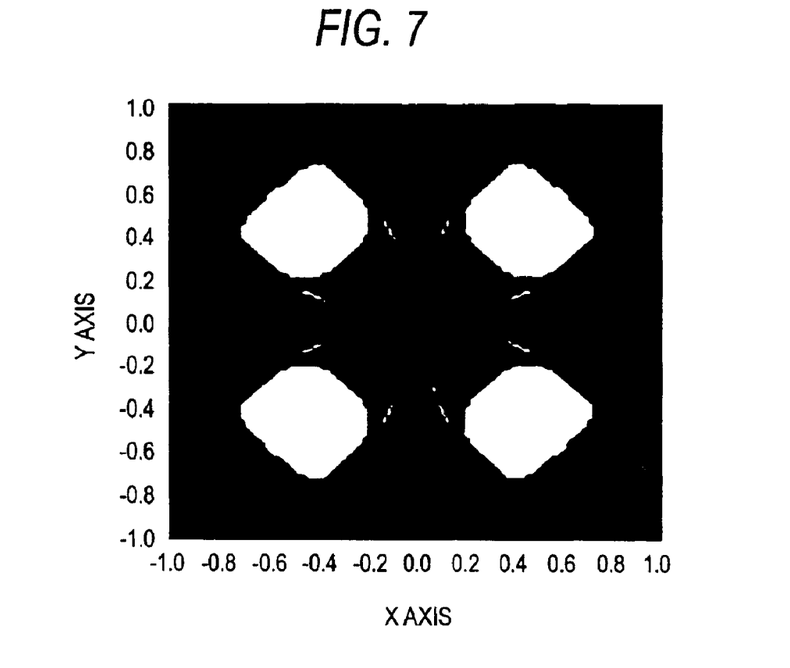
FIG. 7 is a diagram for showing a point light source when the point light source in common with the point light source shown in FIG. 6 is selected.

FIG. 7 shows a result when the calculations till step S212 are carried out by using FIG. 6(a) and FIG. 6(b), and a white portion represents a point light source having NILS not less than 1.6.

Figure 8:
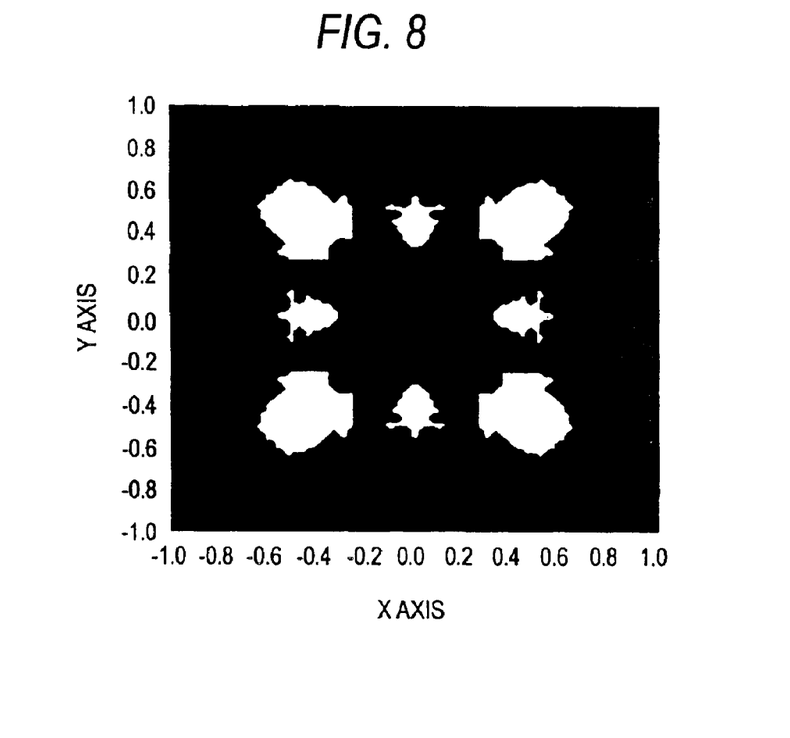
FIG. 8 is a diagram for showing a point light source in common with BF and 0.3 $\mu$m intended for a pattern 2 and a pattern 4.

FIG. 8, similarly, shows a output result when the calculations till step S212 are carried out with respect to the pattern 2 and the pattern 4.

[9] In the next place, in step S213, a map of the point light sources with respect to the patterns having the respective repeat frequencies, which is obtained in the step S212, is synthesized. Specifically, by figuring out the logical product (the logical AND) with the maps of the point light sources shown in FIG. 7 and FIG. 8, a point where the white portions are superposed is extracted. In the step S213, the logical product of the two point light source maps (FIG. 7 and FIG. 8) is figured out in order to select a point light source having the NILS value not less than the threshold value NILSth in common in all of the patterns 1 to 4 to be optimized.

[10] At last, in step S214, when the map of the point light sources outputted in the step S213 satisfies the required number of the point light sources and the correction of the type is not required, the aggregation of the point light sources is outputted as the optimized map of the point light sources, namely, the optimized aperture type to terminate the calculation. When the required number of the point light sources is not attained or the type correction is required, returning to the step S201, and changing the threshold value NILSth in the step S207, the calculations are carried out till the result satisfying the condition is obtained in the step S214. As the required number of the point light source, coherence a may be defined not less than 0.15. According to the present embodiment, since the maximum number of the point light source provided in a circle that the radius of the effective light source coordinate is 1 is 2,601, in the step S214, the required number of the point light source may be defined as 2,601×0.15 is nearly equal to 390 (pieces).

Thus, due to the optimized aperture type according to the first embodiment, with respect to the patterns to be optimized, the margins of both of the defocus variation and the exposure amount variation of the projection aligner can be made larger. Therefore, if the aperture optimized by the present embodiment is used, it is possible to enlarge the focus variation margin and the exposure amount variation margin of the pattern to be optimized.

In the next place, a second embodiment according to the present invention will be described below.

In the aperture type that is optimized by the first embodiment, the aggregation of the point light sources having the NILS values not less than the threshold values NILSth on the effective light source coordinate is regarded as the aperture opening, so that this has possibilities that a very minute opening may be formed in the obtained optimized aperture type, significant irregularities may be formed at the end portion of the opening, and the type correction should be carried out. Then, according to the second embodiment, the type correction is carried out with respect to the optimized aperture type that is outputted in the step S214.

Figure 9:
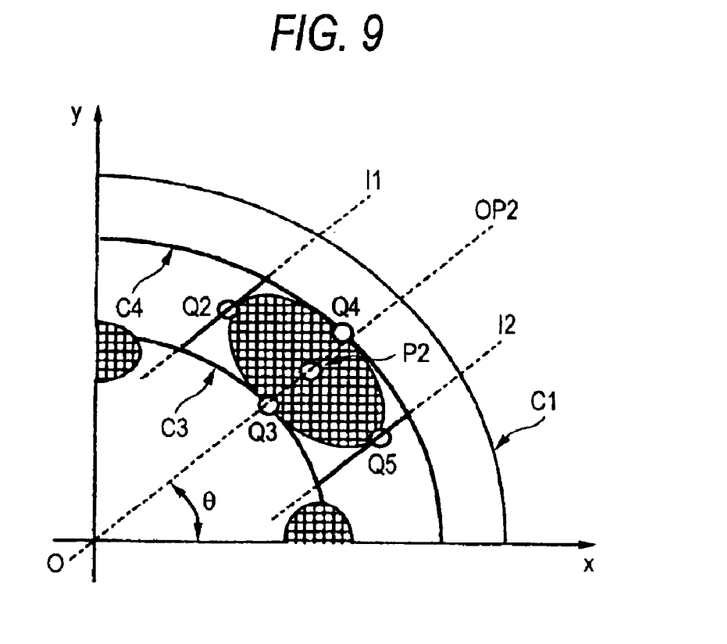
FIG. 9 is an explanatory view of a correction method of an aperture type as the optimization method of the aperture type according to a second embodiment of the present invention.

FIG. 9 is an explanatory view of a correction method of an aperture type as the optimization method of the aperture type according to a second embodiment of the present invention.

According to the present embodiment, as the correction method of the aperture type, assuming the aperture of a four point illumination type and only considering a first image limit, the aperture types from a second image limit to a fourth image limit may be decided by the same method as the first image limit.

As shown in FIG. 9, in the aggregation of the point light sources forming the optimized aperture, after removing a point light source that is not capable of being attained when tracing on the aggregate of the point light sources from the point light source having the maximum value of the foregoing normalized image light intensity slopes in the smallest interval or $\sqrt{2}\times$ the smallest interval, on the effective light source coordinate, a circle C3 passing through the point light source Q3 that is closest to an origin O is defined as an inner diameter of an aperture opening, on the effective light source coordinate, a circle C4 passing through the point light source Q4 that is farthermost from the origin O is defined as an outer diameter of an aperture opening, in each image limit on the foregoing effective light source coordinate, a point light source position having the highest value of the foregoing normalized image light intensity slopes is defined as a center P2 of a fan-like aperture type of each image limit.

Then, a line in parallel with a line OP2 passing through the point light source Q2, angle of direction θ of which is furthermost in a positive direction from the line OP2, is defined as a line 11, a line in parallel with a line OP2 passing through the point light source Q5, angle of direction θ of which is furthermost in a negative direction from the line OP2, is defined as a line 12, and a range that is encircled by the circle C3, the circle C4, the line 11, and the line 12 is defined as an aperture opening.

Figure 10:
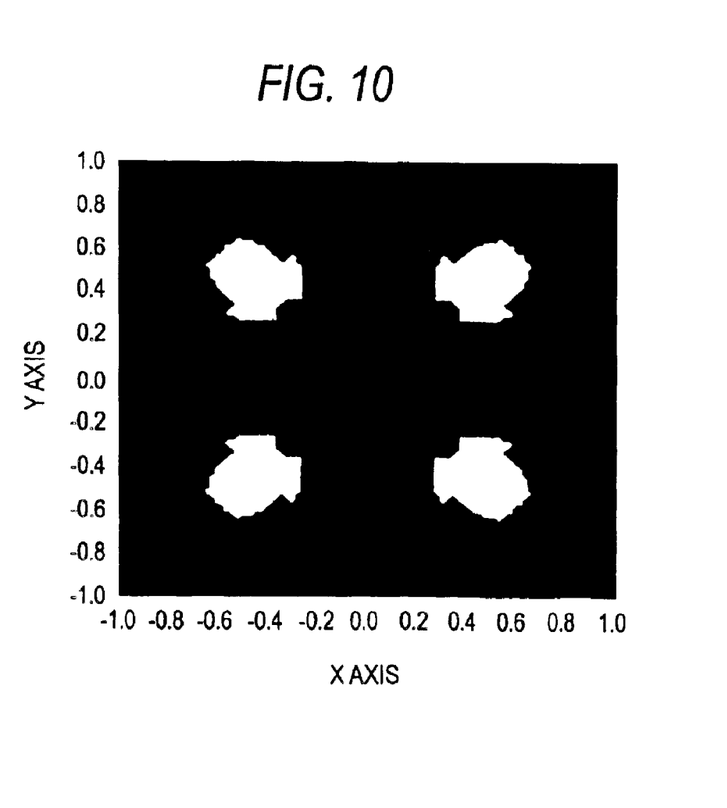
FIG. 10 is a diagram for showing an optimum aperture type having a shape capable of being easily manufactured, which is obtained by the correction method of the aperture type according to the second embodiment of the present invention.

FIG. 10 is a diagram for showing an optimum aperture type having a shape capable of being easily manufactured, which is obtained by the correction method of the aperture type according to the second embodiment of the present invention.

In this way, FIG. 11 shows a result that a process margin is obtained by using the aperture that is optimized as a result of the second embodiment.

For comparison, as a conventional method, a result is shown using an aperture shaped in an orbicular zone with an outer radius σ out=0.85 and an inner radius σ=0.64 for the projection aligner with NA=0.73 and coherence σ=0.85.

Figure 11A:
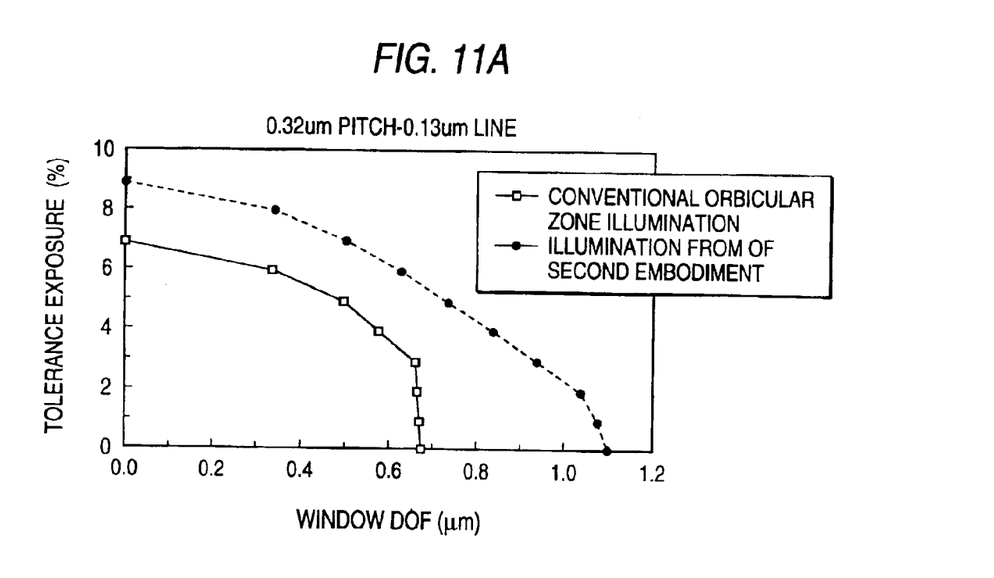
FIG. 11 is a diagram for showing a process window of various patterns when the optimum aperture according to the second embodiment of the present invention is used.
Figure 11B:
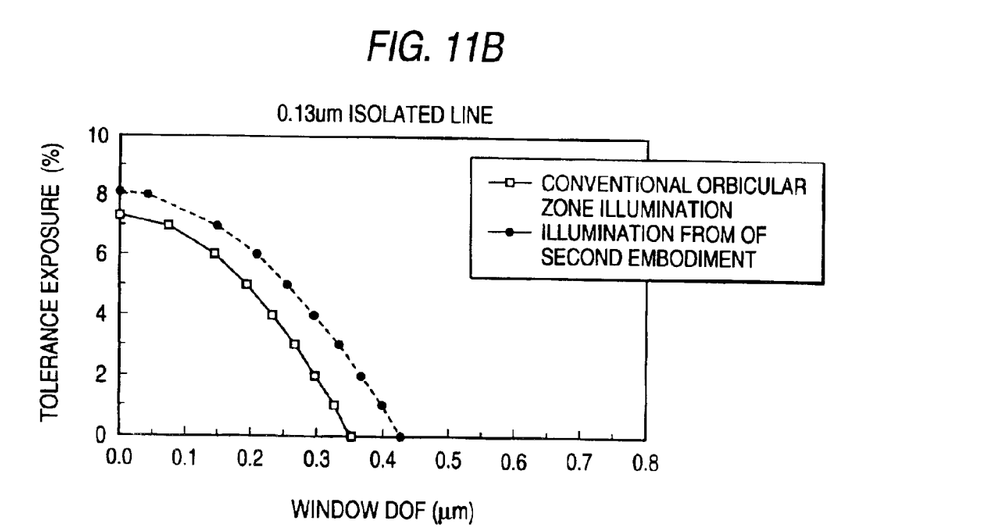

FIG. 11(a) shows so-called E-D window of the L/S pattern having a pattern repeat pitch of 0.32 μm and a line width w1=0.13 μm and FIG. 11(b) shows a result of the L/S pattern having a pattern repeat pitch of 1 μm and a line width w1=0.13 μm. In these drawings, a horizontal axis represents a window DOF (μm) (a defocus margin) and a vertical axis represents an exposure tolerance (%) (a size of an exposure amount margin EL in each defocus).

The pattern used for FIG. 11(a) is a L/S pattern having the size and the pitch close to the maximum resolution of the projection aligner with NA=0.73 and coherence σ=0.85, and the pattern used for FIG. 11(b) is a L/S pattern having the size close to the maximum resolution of the projection aligner, however, not like FIG. 11(a), this is the L/S pattern having the repeat pitch that can be viewed approximately isolated.

As described above, according to the second embodiment, by using the optimized aperture, as compared to the conventional type, the E-D windows of the both patterns, namely, the L/S pattern having the size and the pitch close to the maximum resolution of the projection aligner and the L/S pattern having the size close to the maximum resolution of the projection aligner, however, also having the repeat pitch that can be viewed approximately isolated are enlarged, and this results in making it possible to improve the margin of the process.

In the next place, the other correction method of an aperture type as a third embodiment of the present invention will be described below.

Also, according to the present embodiment, assuming the aperture of a four point illumination type and only considering a first image limit, the aperture types from a second image limit to a fourth image limit may be decided by the same method as the first image limit.

Figure 12:
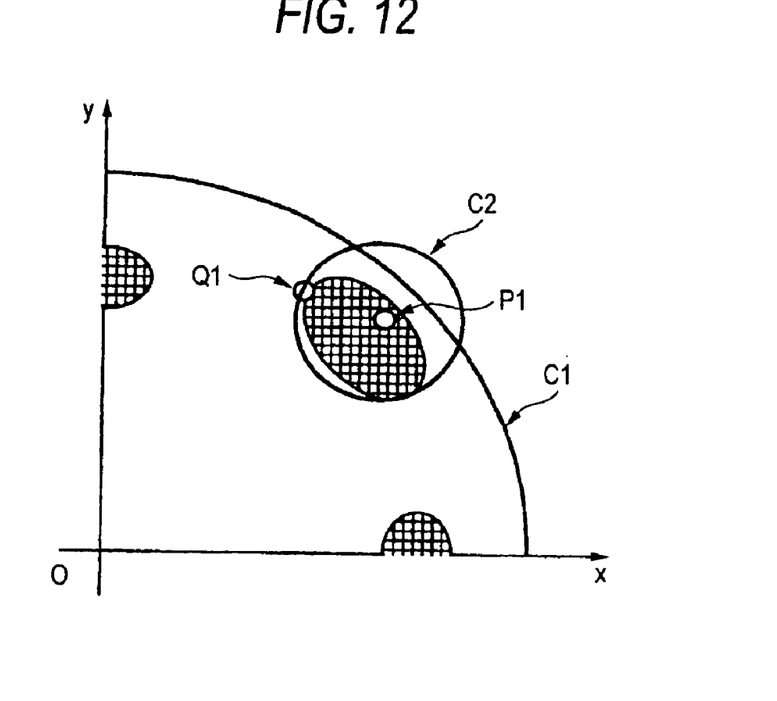
FIG. 12 is an explanatory view of a correction method of an aperture type as the optimization method of the aperture type according to a third embodiment of the present invention.

As shown in FIG. 12, in the aggregation of the point light sources forming the optimized aperture, after removing a point light source that is not capable of being attained when tracing on the aggregate of the point light sources from the point light source having the maximum value of the foregoing normalized image light intensity slopes in the smallest interval or $\sqrt{2}\times$ the smallest interval, a point light source position having the highest value of the normalized image light intensity slopes is defined as a center P1 of each image limit, and a range that is encircled by a circle C2 with a radius, namely, a line P1Q1 connecting the center point of the circle and the farthest point light source Q1 in each image limit and a circle C1 drawn by the maximum a of the foregoing projection aligner is defined as an aperture opening of each image limit.

Figure 13:
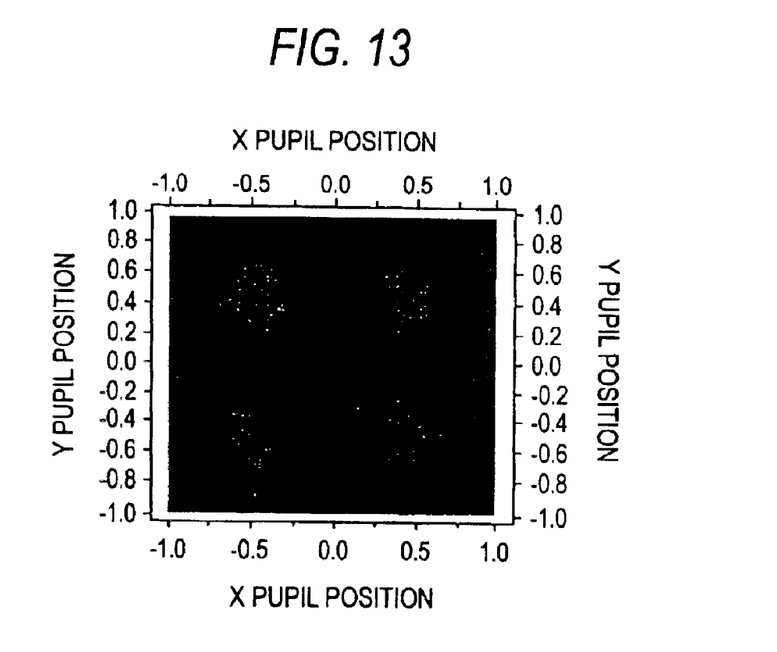
FIG. 13 is a diagram for showing an optimum aperture type, which is obtained by the correction method of the aperture type according to the third embodiment of the present invention.

As a result shown in FIG. 13, a result figuring out a process margin by using the optimized aperture type is shown in FIG. 14. For comparison, as a conventional method, a result is shown using an aperture shaped in an orbicular zone with an outer radius σ out=0.85 and an inner radius σ=0.64 for the projection aligner with NA=0.73 and coherence σ=0.85.

Figure 14A:
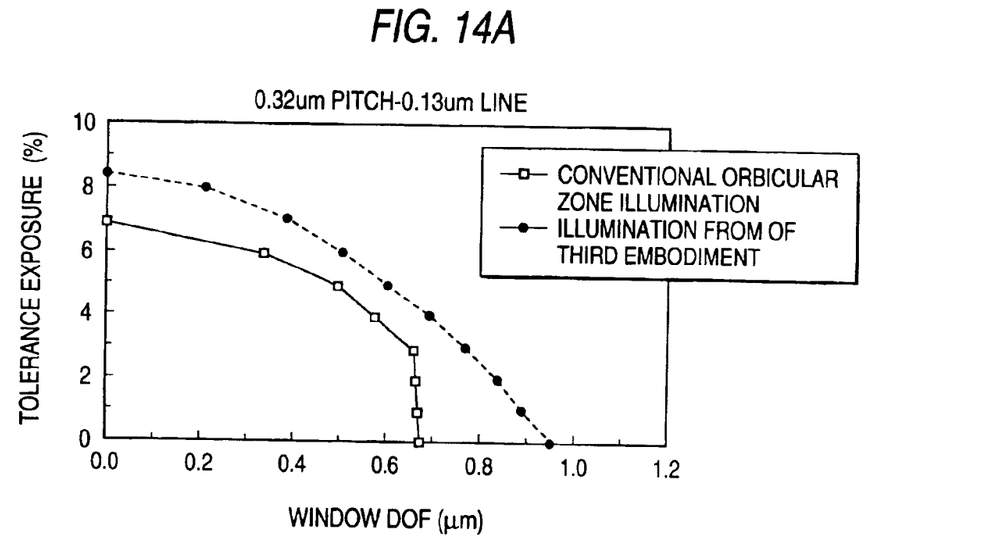
FIG. 14 is a diagram for showing a process window of various patterns when the optimum aperture according to the third embodiment of the present invention is used.
Figure 14B:
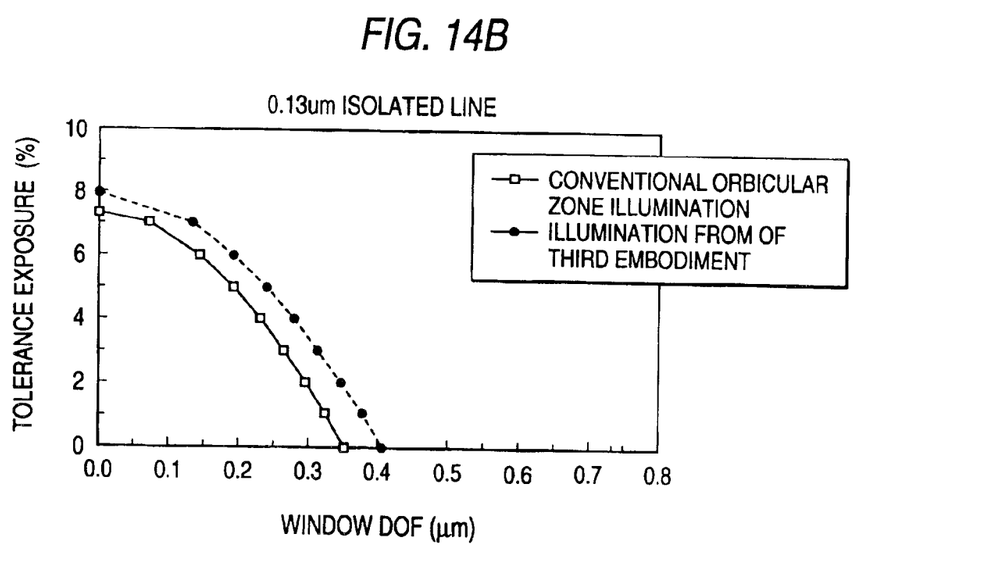

In FIG. 14(a), the used pattern is so-called E-D window of the L/S pattern having a pattern repeat pitch of 0.32 μm and a line width w1=0.13 μm and FIG. 14(b) shows a result of the L/S pattern having a pattern repeat pitch of 1 μm and a line width w1=0.13 μm. In these drawings, a horizontal axis represents a window DOF (μm) (a defocus margin) and a vertical axis represents an exposure tolerance (%) (a size of an exposure amount margin EL in each defocus).

The pattern used for FIG. 14(a) is a L/S pattern having the size and the pitch close to the maximum resolution of the projection aligner with NA=0.73 and coherence σ=0.85, and the pattern used for FIG. 14(b) is a L/S pattern having the size close to the maximum resolution of the projection aligner, however, this is the L/S pattern having the repeat pitch that can be viewed approximately isolated.

As described above, according to the third embodiment, by using the optimized aperture, as compared to the conventional type, the E-D windows of the both patterns, namely, the L/S pattern having the size and the pitch close to the maximum resolution of the projection aligner and the L/S pattern having the size close to the maximum resolution of the projection aligner, however, also having the repeat pitch that can be viewed approximately isolated are enlarged, and this results in making it possible to improve the margin of the process.

In the next place, the further other correction method of an aperture type as a fourth embodiment of the present invention will be described below.

Also, according to the present embodiment, assuming the aperture of a four point illumination type and only considering a first image limit, the aperture types from a second image limit to a fourth image limit may be decided by the same method as the first image limit.

Figure 15:
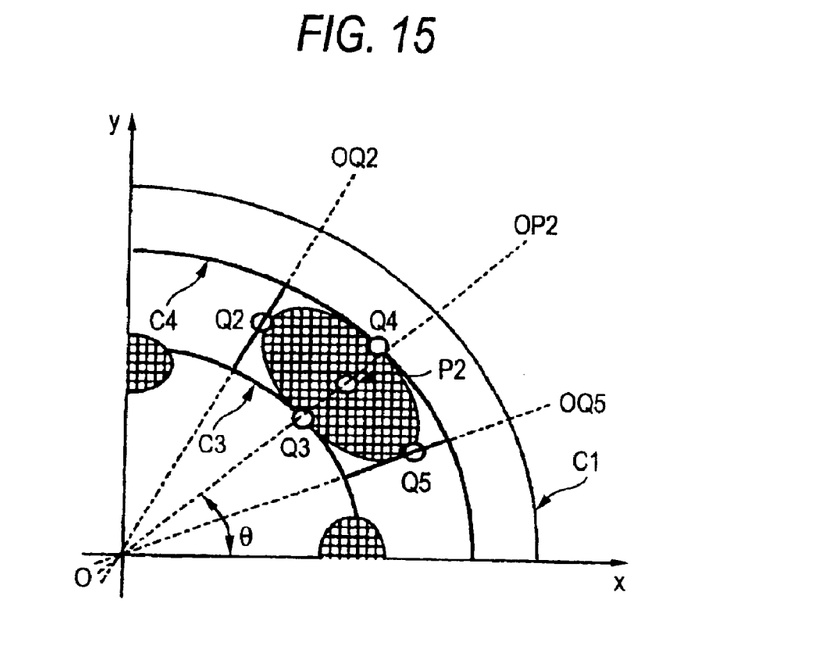
FIG. 15 is an explanatory view of a correction method of an aperture type as the optimization method of the aperture type according to a fourth embodiment of the present invention.

As shown in FIG. 15, in the aggregation of the point light sources forming the optimized aperture, after removing a point light source that is not capable of being attained when tracing on the aggregate of the point light sources from the point light source having the maximum value of the foregoing normalized image light intensity slopes in the smallest interval or √2× the smallest interval, in each image limit, a circle C3 passing through the point light source Q3 that is closest to an origin O is defined as an inner diameter of a fan-like aperture opening, in each image limit, a circle C4 passing through the point light source Q4 that is farthermost from the origin O is defined as an outer diameter of the fan-like aperture opening, a line OQ2 connecting a point light source Q2 having the maximum angle θ with respect to the x axis and the origin O among lines connecting each point light source Q and the origin O is defined as a first line in each image limit, a line OQ5 connecting a point light source Q5 having the smallest angle θ with respect to the x axis and the origin O among lines connecting each point light source Q and the origin O is defined as a second line in each image limit. Then, a range that is encircled by the circle C3, the circle C4, the first line OQ2, and the second line OQ5 is defined as an aperture opening of each image limit.

Figure 16:
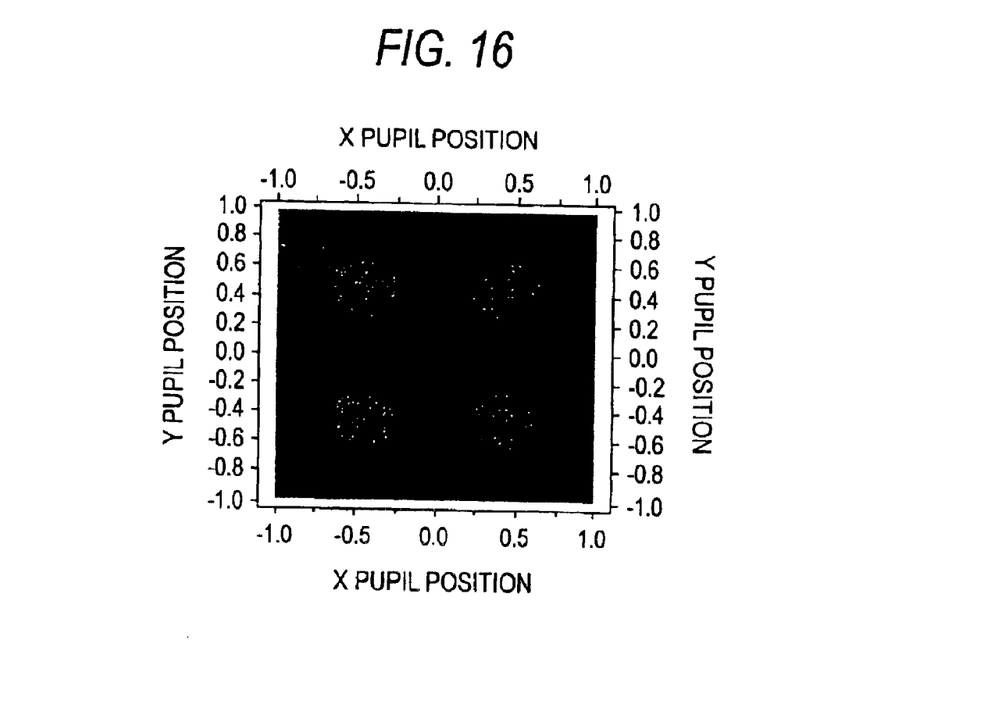
FIG. 16 is a diagram for showing an optimum aperture type, which is obtained by the correction method of the aperture type according to the fourth embodiment of the present invention.

As a result shown in FIG. 16, a result figuring out a process margin by using the optimized aperture type is shown in FIG. 17. For comparison, as a conventional method, a result is shown using an aperture shaped in an orbicular zone with an outer radius σ out=0.85 and an inner radius σ=0.64 for the projection aligner with NA=0.73 and coherence σ=0.85.

Figure 17A:
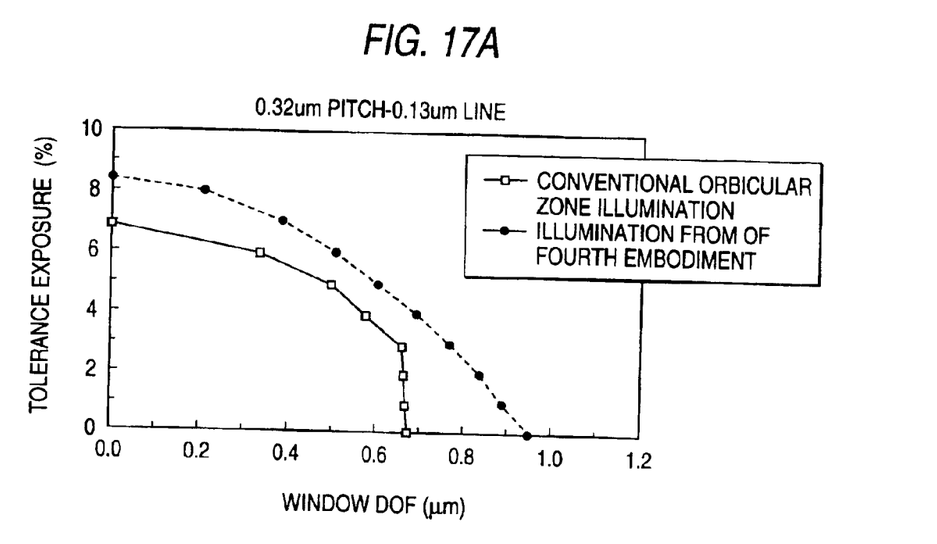
FIG. 17 is a diagram for showing a process window of various patterns when the optimum aperture according to the fourth embodiment of the present invention is used.
Figure 17B:
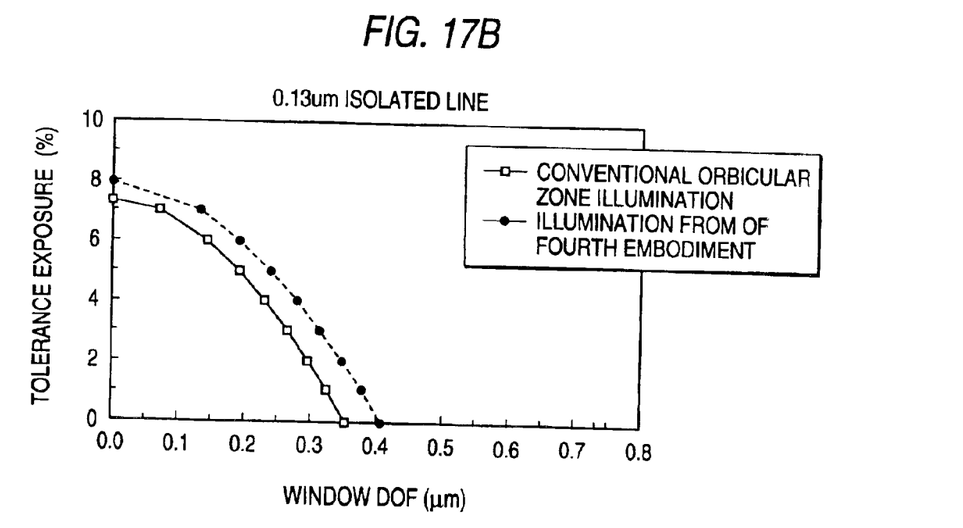

In FIG. 17(a), the used pattern is so-called E-D window of the L/S pattern having a pattern repeat pitch of 0.32 μm and a line width w1=0.13 μm and FIG. 17(b) shows a result of the L/S pattern having a pattern repeat pitch of 1 μm and a line width w1=0.13 μm. In these drawings, a horizontal axis represents a window DOF (μm) (a defocus margin) and a vertical axis represents an exposure tolerance (%) (a size of an exposure amount margin EL in each defocus).

The pattern used for FIG. 17(a) is a L/S pattern having the size and the pitch close to the maximum resolution of the projection aligner with NA=0.73 and coherence σ=0.85, and the pattern used for FIG. 17(b) is a L/S pattern having the size close to the maximum resolution of the projection aligner, however, this is the L/S pattern having the repeat pitch that can be viewed approximately isolated.

As described above, according to the fourth embodiment, by using the optimized aperture, as compared to the conventional type, the E-D windows of the both patterns, namely, the L/S pattern having the size and the pitch close to the maximum resolution of the projection aligner and the L/S pattern having the size close to the maximum resolution of the projection aligner, however, also having the repeat pitch that can be viewed approximately isolated are enlarged, and this results in making it possible to improve the margin of the process.

The present invention is not limited to the above described embodiments, therefore, various modifications are possible on the basis of a spirit of the present invention and these modifications should not be excluded from a scope of the present invention.

As described above, according to the present invention, by using the optimized aperture, it is possible to enlarge a focus variation margin and an exposure amount variation margin of a pattern to be optimized.

In addition, as compared to the conventional type, the E-D windows of the both patterns, namely, the L/S pattern having the size and the pitch close to the maximum resolution of the projection aligner and the L/S pattern having the size close to the maximum resolution of the projection aligner, however, also having the repeat pitch that can be viewed approximately isolated are enlarged, and this results in making it possible to improve the margin of the process.

What is claimed is:

1. A method of optimizing a shape of an aperture comprising:

dividing an effective light source into a plurality of minute areas having same shape and size;

providing one point light source at a center of each of the divided minute areas;

obtaining a normalized image light intensity slope on a wafer in consideration of a focus variation of a projection aligner for a plurality of patterns at each of the point light sources;

using the normalized image light intensity slope of a light intensity as an index, which is related to an exposure amount variation of the projection aligner by one dimensional function;

selecting a common opening for the shape of the aperture that is optimized for each of the patterns; and making the common opening into an optimum shape of the aperture for the patterns.

2. A method of optimizing a shape of an aperture comprising:

dividing an effective light source into a plurality of minute areas each having same shape and size;

providing one point light source at a center of each of the divided minute areas;

selecting a point light source having a high margin with respect to the focus variation and the exposure amount variation of a projection aligner;

obtaining an aggregate of the point light sources and a plurality of normalized image light intensity slopes of each of the point light sources;

in each of first to fourth image limits on an effective light source coordinate, removing the point light source that is not capable of being attained when tracing on the aggregate of the point light sources from the point light source having a maximum value of the normalized image light intensity slopes in the smallest interval or √2× the smallest interval;

on the effective light source coordinate, defining a circle passing through the point light source that is closest to an origin, as an inner diameter of an aperture opening;

on the effective light source coordinate, defining a circle passing through the point light source that is farthermost from the origin, as an outer diameter of an aperture opening;

in each image limit on the effective light source coordinate, defining a point light source position having the highest value of the normalized image light intensity slopes, as a center of a fan-like aperture type of each image limit;

defining a line in parallel with a first line passing through the point light source, angle of direction of which is furthermost in a positive direction from the first line connecting the center of the fan-like aperture and the origin, as a second line;

defining a line in parallel with a first line passing through the point light source, angle of direction of which is furthermost in a negative direction from the first line connecting the center of the fan-like aperture and the origin, as a third line; and defining a range that is encircled by the inner diameter and the outer diameter of the aperture opening, the second line, and the third line, as an aperture opening of each image limit.

3. A method of optimizing a shape of an aperture comprising:

dividing an effective light source into a plurality of minute areas each having same shape and size;

providing one point light source at a center of each of the divided minute areas;

selecting a point light source having a high margin with respect to the focus variation and the exposure amount variation of a projection aligner;

obtaining an aggregate of the point light sources and a plurality of normalized image light intensity slopes of the point light sources;

in each of first to fourth image limits on an effective light source coordinate, removing a point light source that is not capable of being attained when tracing on the aggregate of the point light sources from the point light source having the maximum value of the normalized image light intensity slopes in the smallest interval or $\sqrt{2}\times$ the smallest interval;

defining a point light source position having the highest value of the normalized image light intensity slopes as a center of each image limit; and defining a range that is encircled by a circle with a radius as a line connecting the centerpoint of the circle and the farthest point light source in each image limit and a circle drawn by the maximum σ of the projection aligner as an aperture opening of each image limit.

4. A method of optimizing a shape of an aperture comprising:

dividing an effective light source into a plurality of minute areas each having same shape and size;

providing one point light source at a center of each of the divided minute areas;

selecting a point light source having a high margin with respect to the focus variation and the exposure amount variation of a projection aligner;

obtaining an aggregate of the point light sources and the normalized image light intensity slopes of the point light sources;

in each of first to fourth image limits on an effective light source coordinate, removing a point light source that is not capable of being attained when tracing on the aggregate of the point light sources from the point light source having the maximum value of the normalized image light intensity slopes in the smallest interval or $\sqrt{2}\times$ the smallest interval;

in each image limit, defining a circle passing through the point light source that is closest to an origin as an inner diameter of a fan-like aperture opening;

in each image limit, defining a circle passing through the point light source that is farthermost from the origin, as an outer diameter of the fan-like aperture opening;

defining a line connecting a point light source having the maximum slope and the origin among lines connecting each point light source and the origin, as a first line in each image limit;

defining a line connecting a point light source having the smallest slope and the origin among lines connecting each point light source and the origin, as a second line in each image limit; and defining a range that is encircled by the inner diameter and the outer diameter of the fan-like aperture opening, the first line, and the second line, as an aperture opening of each image limit.

* * * * *